US011665786B2

(12) United States Patent
Morrell et al.

(10) Patent No.: US 11,665,786 B2
(45) Date of Patent: May 30, 2023

(54) SOLID STATE HEATER AND METHOD OF MANUFACTURE

(71) Applicant: Applied Materials, Inc., Santa Clara, CA (US)

(72) Inventors: David Morrell, Gloucester, MA (US); Dawei Sun, Lynnfield, MA (US)

(73) Assignee: Applied Materials, Inc., Santa Clara, CA (US)

( * ) Notice: Subject to any disclaimer, the term of this patent is extended or adjusted under 35 U.S.C. 154(b) by 811 days.

(21) Appl. No.: 16/704,269

(22) Filed: Dec. 5, 2019

(65) Prior Publication Data

US 2021/0176824 A1 Jun. 10, 2021

(51) Int. Cl.
*H05B 1/02* (2006.01)
*C23C 16/32* (2006.01)
*H05B 3/14* (2006.01)

(52) U.S. Cl.
CPC ......... *H05B 1/0233* (2013.01); *C23C 16/325* (2013.01); *H05B 3/145* (2013.01); *H05B 3/148* (2013.01)

(58) Field of Classification Search
CPC ...... H05B 3/148; H05B 3/283; H05B 1/0233; H05B 3/145; H05B 2203/003; H05B 2203/017; C04B 41/52; C04B 41/009; C04B 41/87; C04B 41/53; C04B 41/91; C04B 35/522; C04B 41/5059; C04B 41/4531; C04B 41/4592; C04B 41/4556; C04B 41/4572; C04B 2237/363; C04B 2237/365; B32B 18/00
USPC ...................................................... 219/444.1
See application file for complete search history.

(56) References Cited

U.S. PATENT DOCUMENTS

| | | | | | |
|---|---|---|---|---|---|
| 5,154,862 | A | * | 10/1992 | Reagan | ............... C04B 41/5059 427/249.15 |
| 5,348,765 | A | * | 9/1994 | Reagan | ............... C04B 41/5059 427/248.1 |
| 6,140,624 | A | * | 10/2000 | Gilbert, Sr. | ............ H05B 3/265 219/548 |
| 7,176,417 | B2 | * | 2/2007 | Johnsgard | ......... H01L 21/67103 338/308 |

(Continued)

FOREIGN PATENT DOCUMENTS

| | | |
|---|---|---|
| JP | 8-17745 A | 1/1996 |
| KR | 10-2018-0106625 A | 10/2018 |
| TW | 200817526 A | 4/2008 |

OTHER PUBLICATIONS

International Search Report and Written Opinion dated Mar. 2, 2021 in corresponding PCT application No. PCT/US2020/060189.

*Primary Examiner* — Eric S Stapleton
(74) *Attorney, Agent, or Firm* — Nields, Lemack & Frame, LLC

(57) ABSTRACT

A solid state heater and methods of manufacturing the heater is disclosed. The heater comprises a unitary component that includes portions that are graphite and other portions that are silicon carbide. Current is conducted through the graphite portion of the unitary structure between two or more terminals. The silicon carbide does not conduct electricity, but is effective at conducting the heat throughout the unitary component. In certain embodiments, chemical vapor conversion (CVC) is used to create the solid state heater. If desired, a coating may be applied to the unitary component to protect it from a harsh environment.

15 Claims, 7 Drawing Sheets

(56) References Cited

U.S. PATENT DOCUMENTS

| | | | |
|---|---|---|---|
| 8,809,800 B2* | 8/2014 | Koo | H01J 37/3171 |
| | | | 250/424 |
| 9,287,079 B2* | 3/2016 | Chaney | H01J 27/022 |
| 11,117,806 B2* | 9/2021 | Scoggins | C04B 41/5059 |
| 11,319,629 B2* | 5/2022 | Fischer, III | C23C 16/01 |
| 2002/0100753 A1* | 8/2002 | Johnsgard | H01L 21/67103 |
| | | | 219/468.1 |
| 2004/0173161 A1* | 9/2004 | Mariner | H05B 3/143 |
| | | | 118/728 |
| 2006/0057287 A1* | 3/2006 | Foss | C04B 35/584 |
| | | | 427/248.1 |
| 2007/0284108 A1* | 12/2007 | Roes | B32B 15/013 |
| | | | 166/302 |
| 2011/0221084 A1* | 9/2011 | Goodman | C04B 35/571 |
| | | | 264/29.5 |
| 2016/0024648 A1* | 1/2016 | Bolton | G02B 5/0833 |
| | | | 264/1.7 |
| 2017/0241016 A1* | 8/2017 | Bolton | C23C 16/4488 |
| 2018/0240878 A1* | 8/2018 | Scoggins | H01L 21/02425 |
| 2020/0040449 A1* | 2/2020 | Fischer, III | C23C 16/01 |

\* cited by examiner

SOLID STATE HEATER AND METHOD OF MANUFACTURE

FIELD

Embodiments of the present disclosure relate to a solid state heater and methods for the manufacture of the heater.

BACKGROUND

The fabrication of a semiconductor device involves a plurality of discrete and complex processes. In certain processes, it may be advantageous to perform one or more of these processes at elevated temperatures.

For example, within an ion source, different gasses may be best ionized at different temperatures. Larger molecules are preferably ionized at lower temperatures to ensure that larger molecular ions are created. Other species may be best ionized at higher temperatures.

Similarly, there are other processes in the fabrication of a semiconductor device where elevated temperatures may be beneficial. These elevated temperatures may be achieved through the use of heaters. In certain embodiments, these heaters may be radiant heaters, such as heat lamps. In other embodiments, these heaters may be resistive heaters.

In certain applications, the formation of a heater may be challenging. For example, the space afforded for the heater may be limited. Further, the environment in which the heater is disposed may be harsh, such as within an arc chamber.

Therefore, it would be advantageous if there were a solid state heater that was durable, able to survive harsh environments and can be formed in a plurality of different shapes and sizes. Further, it would be advantageous if this solid state heater was relatively easy to manufacture.

SUMMARY

A solid state heater and methods of manufacturing the heater is disclosed. The heater comprises a unitary component that includes portions that are graphite and other portions that are silicon carbide. Current is conducted through the graphite portion of the unitary structure between two or more terminals. The silicon carbide does not conduct electricity, but is effective at conducting the heat throughout the unitary component. In certain embodiments, chemical vapor conversion (CVC) is used to create the solid state heater. If desired, a coating may be applied to the unitary component to protect it from a harsh environment.

According to one embodiment, a solid state heater is disclosed. The solid state heater comprises a unitary component, having: a first portion comprising silicon carbide; and a second portion comprising graphite; wherein the second portion forms a continuous conductive path; and electrical contacts in electrical communication with the continuous conductive path. In certain embodiments, the continuous conductive path comprises a serpentine pattern. In certain embodiments, the solid state heater comprises a coating disposed on the unitary component. In some further embodiments, the coating comprises silicon carbide. In certain embodiments, the front surface and the back surface of the unitary component are planar.

According to another embodiment, a method of manufacturing a solid state heater is disclosed. The method comprises machining a graphite component to create a machined graphite component having thin portions and thicker portions; subjecting the machined graphite component to a chemical vapor conversion (CVC) process where silicon monoxide is introduced to a processing chamber containing the machined graphite component, wherein the CVC process creates a unitary component having a first portion where graphite is converted to silicon carbide and a second portion where the graphite remains; and connecting electrical contacts to the second portion. In certain embodiments, the first portion is created in a region that is less than a diffusion depth from a surface of the graphite component. In certain embodiments, the second portion comprises graphite that is further than the diffusion depth from either surface of the graphite component. In some embodiments, a thickness of the thin portion is less than or equal to twice the diffusion depth. In some embodiments, a thickness of the thicker portion is greater than twice the diffusion depth. In certain embodiments, the method comprises grinding a front surface and/or a rear surface of the unitary component. In some embodiments, the front surface and/or the rear surface of the unitary component are planar after the grinding. In certain embodiments, the method further comprises applying a coating to the unitary component. In some embodiments, applying a coating comprises subjecting the unitary component to a chemical vapor deposition (CVD) process.

According to another embodiment, a method of manufacturing a solid state heater is disclosed. The method comprises subjecting a graphite component to a chemical vapor deposition (CVD) process to apply a silicon carbide coating to a surface of the graphite component; selectively removing the silicon carbide coating from portions of the surface to form a silicon carbide mask; subjecting the graphite component with the silicon carbide mask to a chemical vapor conversion (CVC) process where silicon monoxide is introduced to a processing chamber containing the graphite component with the silicon carbide mask, wherein the CVC process creates a unitary component having a first portion where graphite is converted to silicon carbide and a second portion where the graphite remains; and connecting electrical contacts to the second portion. In certain embodiments, the first portion is created in a region that is not covered by the silicon carbide mask, and the second portion is formed in the region under the silicon carbide mask. In some embodiments, the method further comprises grinding the surface of the unitary component to remove the silicon carbide mask. In some embodiments, the method further comprises applying a coating to the unitary component. In certain embodiments, the first portion is created in a region that is less than a diffusion depth from a surface of the graphite component not covered by the silicon carbide mask. In certain embodiments, the thickness of the graphite component is less than twice the diffusion depth.

BRIEF DESCRIPTION OF THE FIGURES

For a better understanding of the present disclosure, reference is made to the accompanying drawings, which are incorporated herein by reference and in which.

DETAILED DESCRIPTION

As described above, heaters are used throughout the semiconductor fabrication process. This disclosure describes a solid state heater that is constructed as a unitary component. Throughout this disclosure, "a unitary component" is defined as a single integral component that comprises both graphite and silicon carbide in the same component. This definition precludes structures that are created by bonding different components together, or otherwise affixing two different components to one another.

Figure 1:
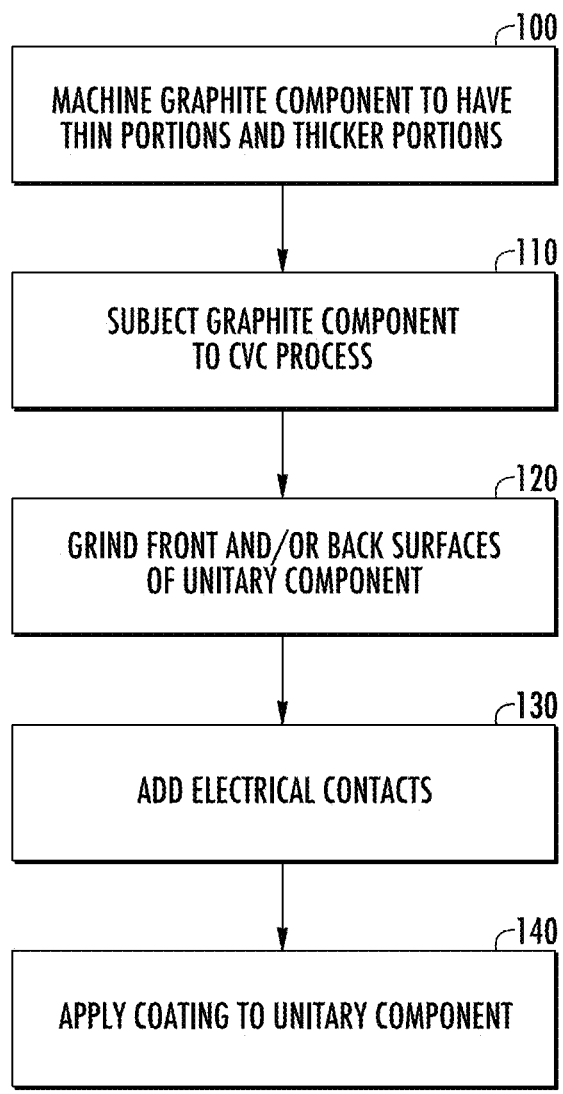
FIG. 1 shows a sequence that may be used to produce a solid state heater according to one embodiment.

FIG. 1 shows a sequence of processes that may be used to create a solid state heater. First, as shown in Box 100, a graphite component is machined to create thin portions and thicker portions. The graphite component may be any shape, such as rectangular, circular, oval, or another other suitable shape. In certain embodiments, the graphite component may be a graphite plate having an arbitrary length and width. In other words, the size of the graphite component is also not limited by this disclosure. Further, the thickness of the graphite component is also not limited by this disclosure. For example, in certain embodiments, the graphite component is a graphite plate having a thickness of millimeters or more. In this disclosure, a "plate" is a rectangular prism where the thickness is less than the length and width.

As noted above, the graphite component is machined to create thin portions and thicker portions. In certain embodiments, the thin portions may have a thickness that is less than or equal to twice the diffusion depth of the chemical vapor conversion (CVC) process. This diffusion depth is a function of the porosity of the graphite component, the duration of the CVC process and other factors. For example, in certain embodiments, the diffusion depth may be roughly 700 micrometers. In this embodiment, the maximum thickness of the thin portions may be 1.4 millimeters. The thicker portions are defined as those portions of the graphite component having a thickness that is more than twice the diffusion depth.

The thicker portions of the machined graphite component will become the conduction path for current flowing through the solid state heater. In certain embodiments, the graphite component is machined such that the thicker portion forms a serpentine shape, although other shapes are also possible.

Figure 2:
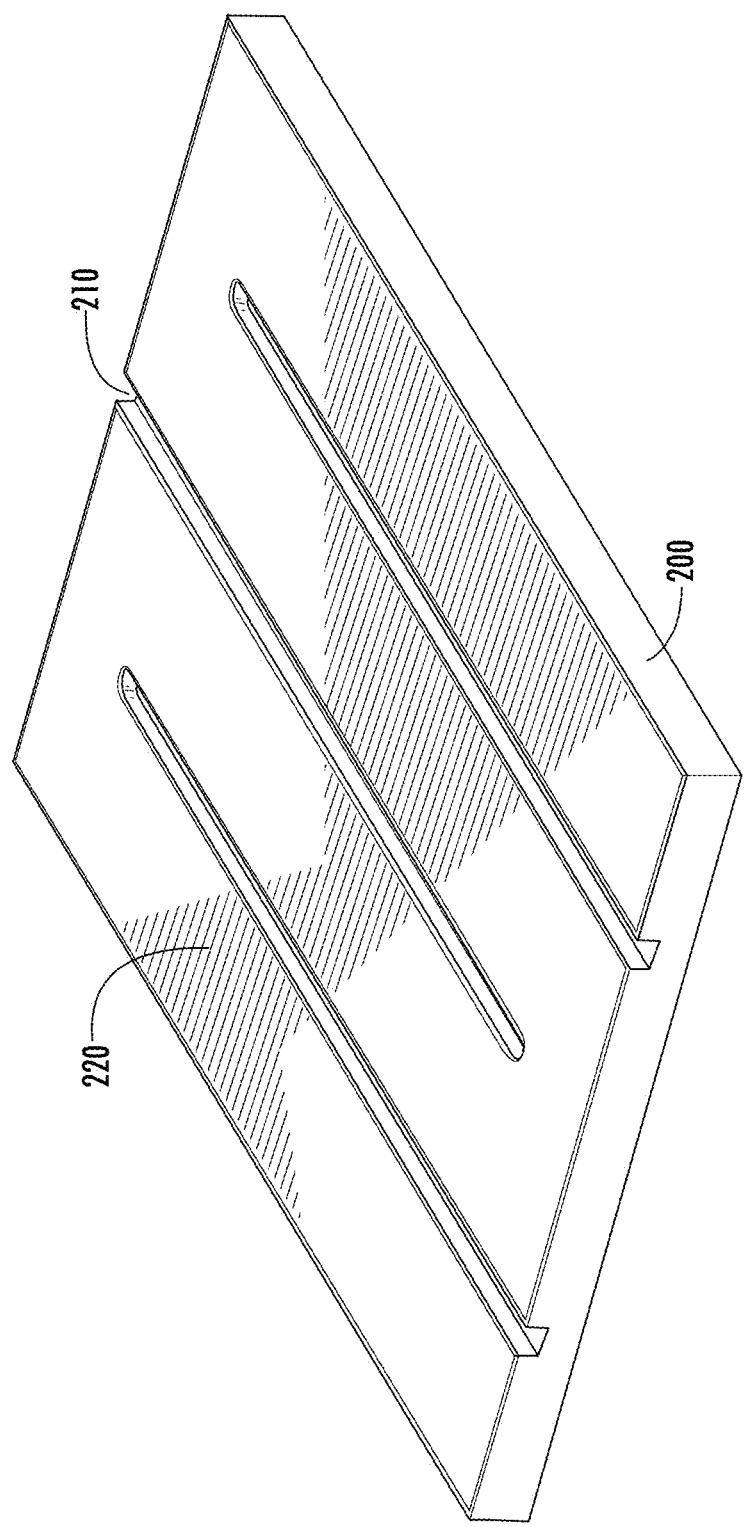
FIG. 2 shows a graphite plate that may be used to create the solid state heater according to the embodiment of FIG. 1.

FIG. 2 shows a graphite component 200, in the form of a graphite plate. In this figure, thin portions 210 have been created as shallow channels on one surface of the graphite component 200. This may be done using standard milling practices. In other embodiments, shallow channel may be machined into both surfaces of the graphite component.

Those portions of the graphite component 200 that have not been machined may be referred to as thicker portions 220. Note that the thicker portions 220 of the graphite component 200 form a serpentine pattern in this embodiment. In this figure, the thin portions 210 are less than 1.4 millimeters, while the thicker portions 220 are 2.0 millimeters. Note that other dimensions may also be used, as long as the thin portions 210 are less than twice the diffusion depth and the thicker portions 220 are more than twice the diffusion depth.

Figure 3:
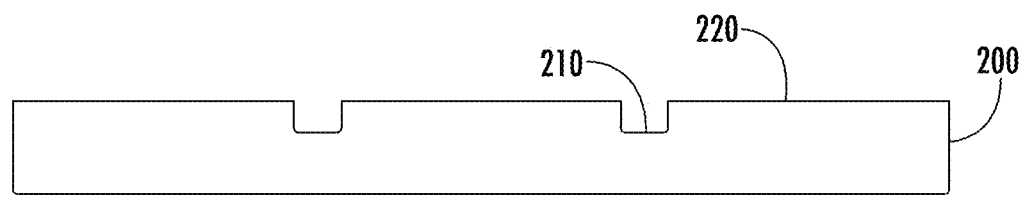
FIG. 3 shows a cross section of the graphite plate of FIG. 2.
Figure 4:
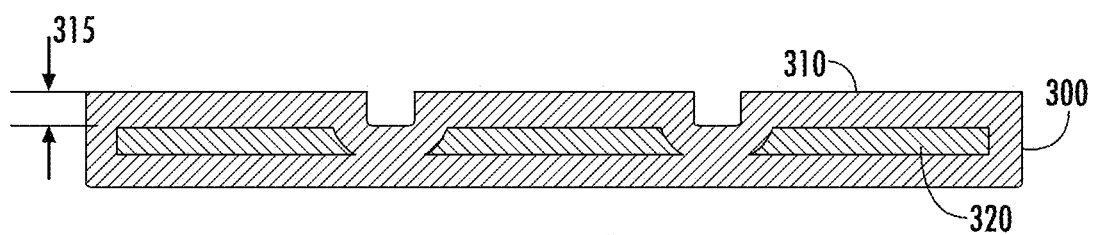
FIG. 4 shows the cross section of the graphite plate after the chemical vapor conversion process.

Referring to FIG. 1, after the graphite component has been machined, it is subjected to a chemical vapor conversion (CVC) process, as shown in Box 110. In this CVC process, the machined graphite component 200 is placed within a processing chamber. Silicon monoxide (SiO) is introduced into the processing chamber. The silicon monoxide reacts with the graphite component as shown in the following equation: $SiO+2C \rightarrow SiC+CO$. In other words, one molecule of silicon monoxide reacts with two atoms of carbon in the machined graphite component 200 to form one molecule of silicon carbide and release one molecule of carbon monoxide. This process continues until there is no exposed carbon remaining in the machined graphite component 200. The depth of diffusion refers to the depth, as measured from the outer surface, through which the graphite component has been converted to silicon carbide. In other words, at depths greater than the diffusion depth, the graphite component will remain graphite. FIG. 3 shows a cross-section of the machined graphite component 200 of FIG. 2, prior to the CVC process. FIG. 4 shows the machined component of FIG. 3 following the CVC process. Note that the machined graphite component has been transformed into a unitary component 300 having first portions 310 that are silicon carbide and second portions 320 that remain graphite. Again, the thickness measured from the front surface to the second portions 320 is defined as the diffusion depth 315. Note that if the thin portions 210 are less than twice the diffusion depth 315, the entirety of the thin portions 210 become first portions 310, comprised of silicon carbide. However, since the thicker portions 220 are thicker than twice the diffusion depth 315, the interior of the thicker portions 220 remain second portions 320, comprised of graphite. In this figure, the second portions 320 have a thickness of about 600 micrometers.

Note that by placement of the shallow channels, it is possible to create a first portion 310 that serves to separate two second portions 320 from one another.

Silicon carbide and graphite have very different characteristics. Silicon carbide has an electrical resistance that is 100 times greater than graphite. Specifically, silicon carbide has an electrical resistivity of about $10^2$-$10^6$ ohm-cm (depending on purity). Graphite has an electrical resistivity of about 0.01 ohm-cm. Graphite has a thermal conductivity of up to about 85 W/m-K, while CVC silicon carbide has a thermal conductivity of about 170 W/m-K.

Figure 5:
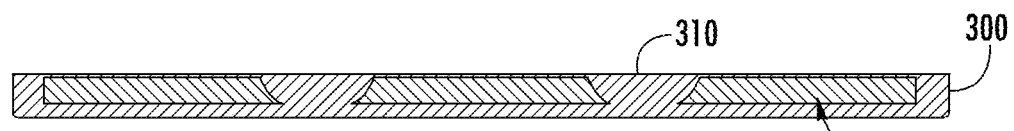
FIG. 5 shows the cross section of the graphite plate after a grinding process.

Next, as shown in Box 120 of FIG. 1, the unitary component 300 is optionally grinded to a desired thickness. This is also shown in FIG. 5. In certain embodiments, the unitary component 300 is grinded to a depth such that the second portions 320 are exposed on one or both surfaces of the unitary component 300. In FIG. 5, the front surface has been grinded to expose the second portions 320, while the back surface has been grinded to a lesser depth. In certain embodiments, the top surface and the back surface are both grinded so as to be planar.

Figure 6:
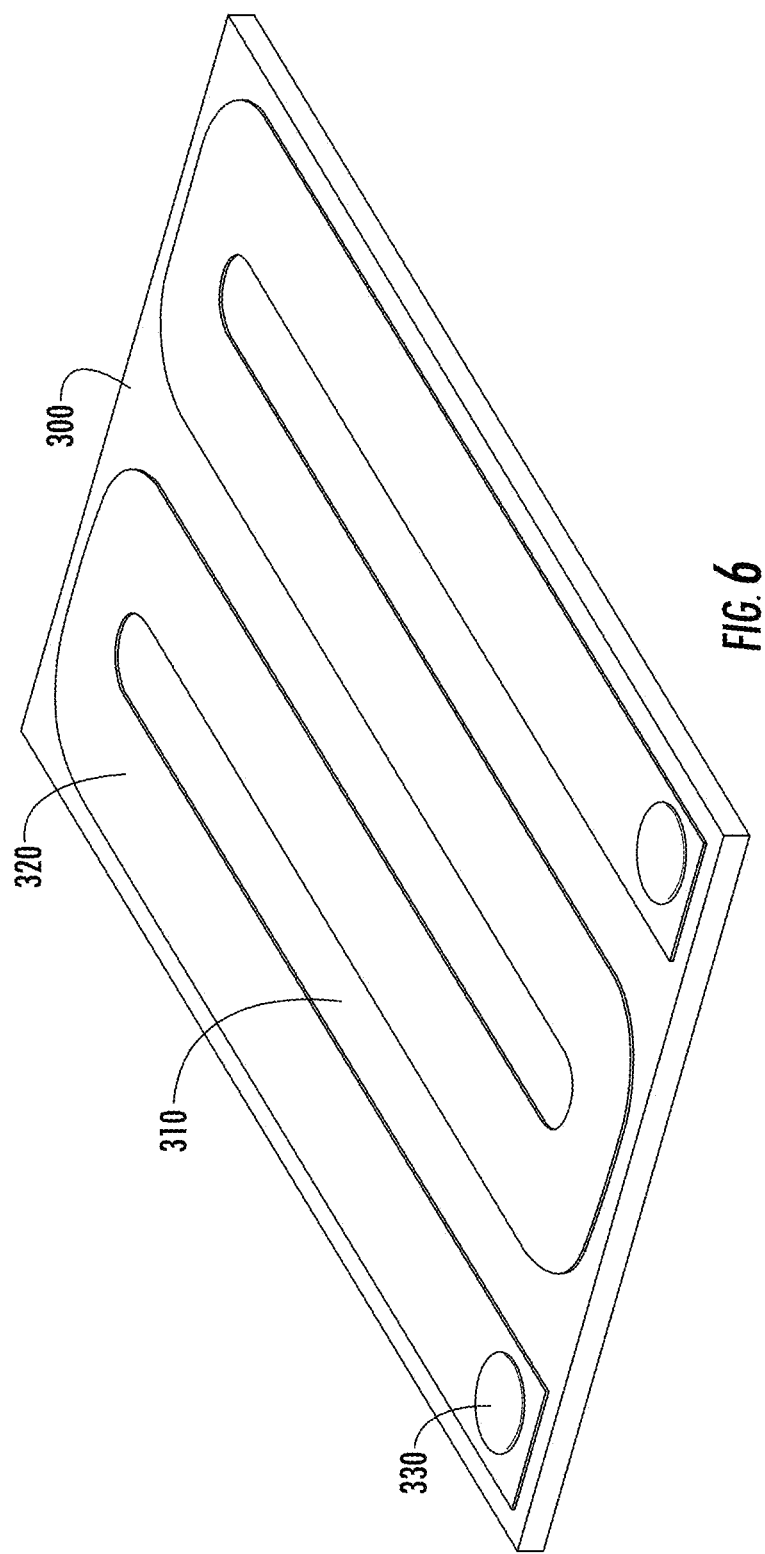
FIG. 6 shows the solid state heater after the electrical contacts have been added.

Next, as shown in Box 130, the electrical contacts are added to the unitary component 300 to transform the unitary component 300 into a solid state heater. In some embodiments, holes are drilled in to the second portion 320 at at least two locations. In certain embodiments, the second portion 320 form a continuous conductive path, and the electrical contacts are disposed at opposite ends of this continuous conductive path. FIG. 6 shows the unitary component 300, where the second portion 320 forms a serpentine path. The first portions 310 are disposed between the adjacent portions of the serpentine path. Electrically contacts 330, in the form of drilled holes, are created at opposite ends of the serpentine path.

Finally, as shown in Box 140, a coating is optionally applied to the unitary component 300. For example, in one embodiment, a layer of silicon carbide may be deposited on the surfaces of the unitary component 300. This deposition may be performed using a chemical vapor deposition (CVD) process, or any suitable process. The coating is not limited to silicon carbide. In other embodiments, a different material may be used as the coating. The coating may be used to electrically isolate the exposed second portions 320 from the external environment.

Note that this approach may be useful when it is desirable that the total thickness of the solid state heater is greater than twice the diffusion depth, or thick conductive paths are desirable. Note that the thickness of the thicker portions 220 is not limited by this approach.

While FIGS. 1-6 show one approach to creating the solid state heater, other approaches that utilize the CVC process may also be used.

Figure 7:
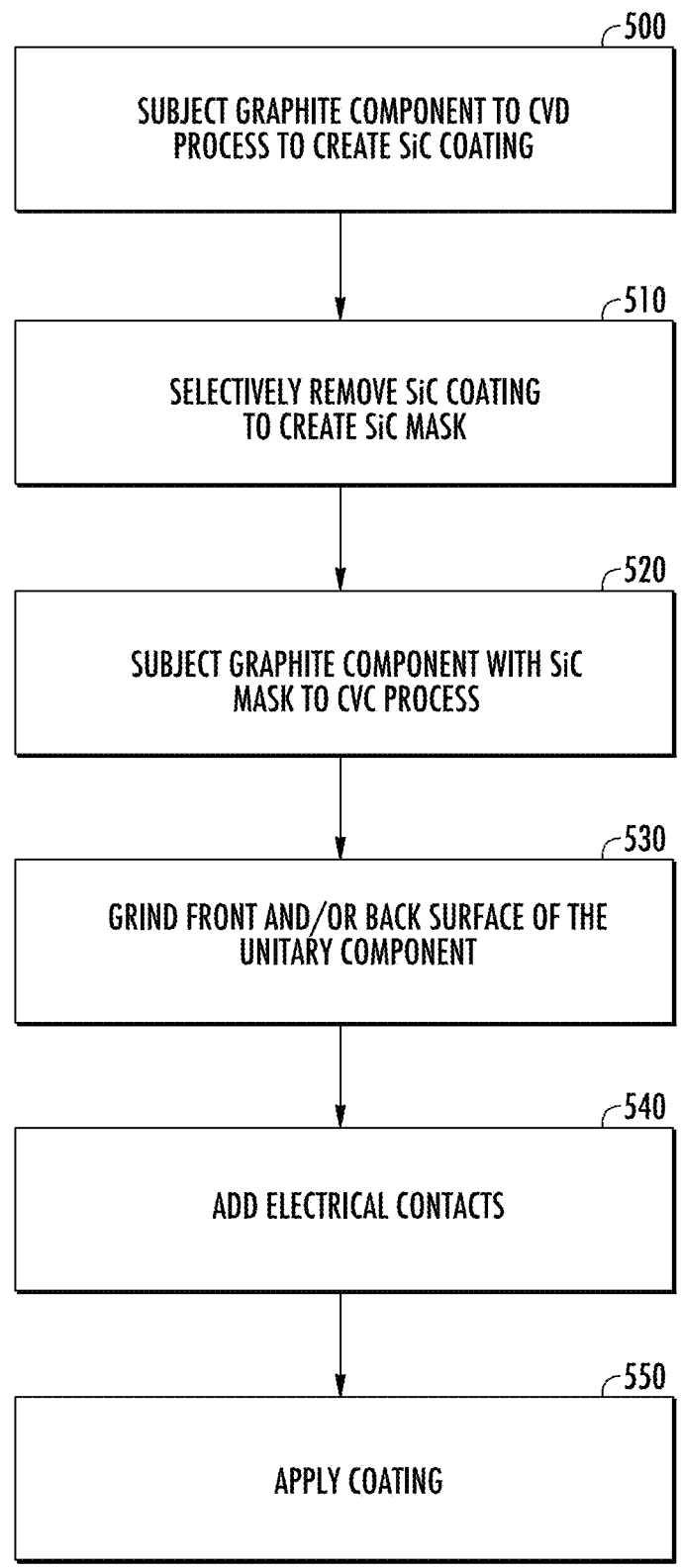
FIG. 7 shows a sequence that may be used to produce a solid state heater according to another embodiment.
Figure 8:
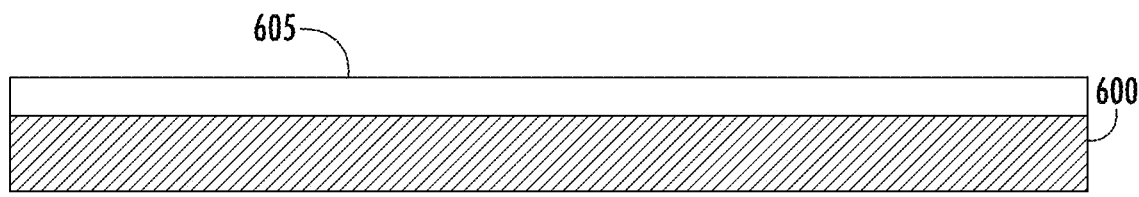
FIG. 8 shows a cross section of a graphite plate with a SiC coating after a chemical vapor deposition process.

For example, in another embodiment, a mask is disposed on portions of a graphite component to create the unitary component. FIG. 7 shows the sequence of processes to produce the solid state heater using this approach. First, as shown in Box 500, a silicon carbide coating is applied to at least one surface of the graphite component. The graphite component may be planar. For example, the graphite component may be a graphite plate. In certain embodiments, a chemical vapor deposition (CVD) process is used to deposit the silicon carbide coating on top of the graphite component 600. An example is shown in FIG. 8, where the silicon carbide coating 605 is disposed on the front surface of the graphite component 600.

Figure 9:
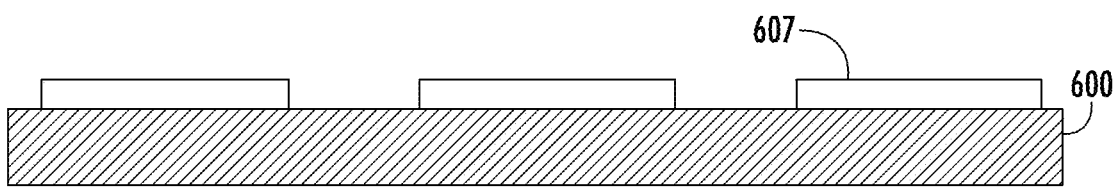
FIG. 9 shows a cross section of the graphite plate of FIG. 8 after portions of the SiC coating have been removed to create the silicon carbide mask.

Next, as shown in Box 510, portions of the silicon carbide coating 605 are then selectively removed to produce a silicon carbide mask 607. The silicon carbide coating 605 may be removed using a grinding process for example. An example of the graphite component 600 with the silicon carbide mask 607 is shown in FIG. 9.

Figure 10:
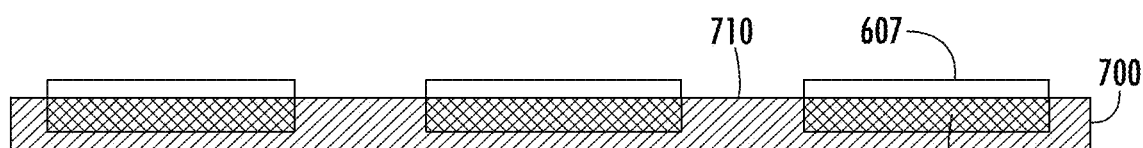
FIG. 10 shows a cross section of the unitary component of FIG. 9 after a chemical vapor conversion process.

The graphite component 600 with the silicon carbide mask 607 is then subjected to a CVC process, as shown in Box 520. After completion of the CVC process, as seen in FIG. 10, a unitary component 700 is created, having first portions 710 that are comprised of silicon carbide and second portions 720 that remain graphite. Note that in this embodiment, the region of the graphite component 600 that are disposed beneath the silicon carbide mask 607 becomes the second portions 720, while the exposed regions of the graphite component 600 become the first portions 710. Note that in certain embodiments, the starting thickness of the graphite component 600 may be less than twice the diffusion depth to ensure that the first portions 710 extend through the thickness of the unitary component 700.

Figure 11:
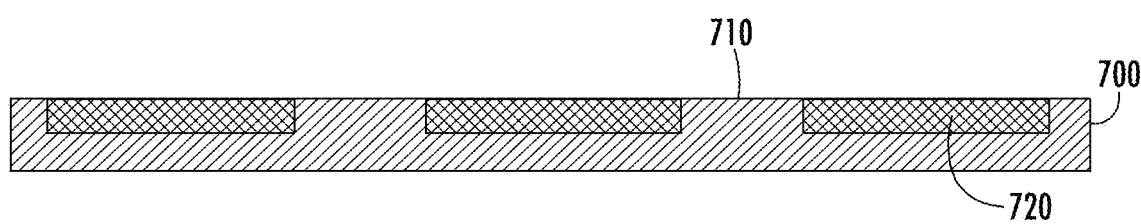
FIG. 11 shows a cross section of the unitary component of FIG. 10 after a grinding process.

Next, as shown in Box 530, the unitary component 700 may be subjected to a grinding process to remove the silicon carbide mask 607 from the front surface. Thus, after the grinding process, the unitary component 700 may be a planar component having first portions 710 and second portions 720 disposed on one surface as shown in FIG. 11.

Next, as shown in Box 540, the electrical contacts are added to the unitary component 700 to transform the unitary component 700 into a solid state heater. In some embodiments, holes are drilled in to the second portion 720 at at least two locations. In certain embodiments, the second portion 720 forms a continuous conductive path, and the electrical contacts are disposed at opposite ends of this continuous conductive path. This continuous conductive path may be a serpentine path. The first portions 710 are disposed between the adjacent portions of the serpentine path. Electrical contacts, which may be in the form of drilled holes, are created at opposite ends of the serpentine path.

Figure 12:
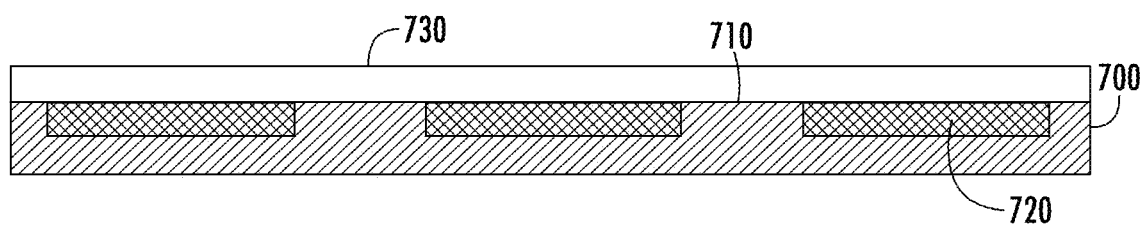
FIG. 12 shows a cross section of the unitary component of FIG. 11 after a chemical vapor deposition process.

Finally, as shown in Box 550, a coating is optionally applied to the unitary component 700. For example, in one embodiment, a layer of silicon carbide 730 may be deposited on at least one surface of the unitary component 700, as shown in FIG. 12. This deposition may be performed using a chemical vapor deposition (CVD) process, or any suitable process. The coating is not limited to silicon carbide. In other embodiments, a different material may be used as the coating. The coating may be used to electrically isolate the exposed second portions 720 from the external environment.

Note that this process may be useful when it is desirable that the total thickness of the solid state heater is less than twice the diffusion depth.

Thus, a solid state heater is disclosed. The solid state heater comprises a unitary component that has a first portion comprising silicon carbide and a second portion comprising graphite. This unitary component may be created using a CVC process. The second portion forms a continuous conductive path. Electrical contacts are disposed on opposite ends of this continuous conductive path. In certain embodiments, the continuously conductive path is formed as a serpentine path. In certain embodiments, a coating is applied to the outer surfaces of the unitary component to isolate the unitary component from the external environment.

Figure 13:
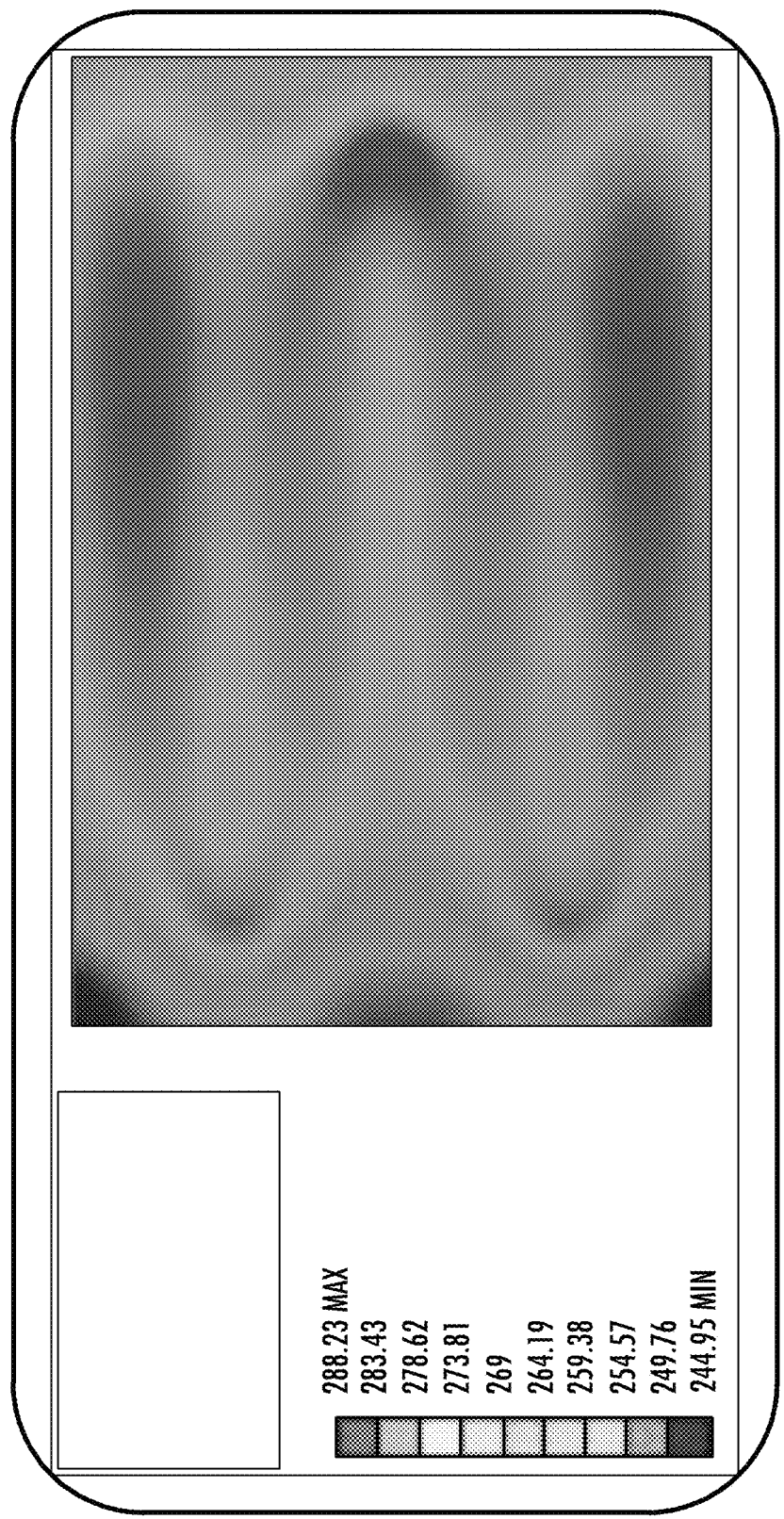
FIG. 13 shows a simulated thermal map for a solid state heater.

The present system has many advantages. First, this approach allows unitary components to be created that may serve as heaters. The combination of materials in the unitary component ensures that current is conducted through the graphite. However, because the thermal conductivity of silicon carbide is relatively high, the heat may diffuse throughout the entire heater. FIG. 13 shows a simulated thermal map of the solid state heater shown in FIG. 6. The second portion is clearly visible as the hotter portion of the solid state heater; however, heat is also distributed to the first portions so that the temperature variation across the surface of the solid state heater is less than 45° C.

Additionally, the process to create the solid state heater places no restrictions on the conductive paths that are created in the solid state heater. For example, the conductive path may have varying widths so as to create hot spots and cooler areas, if desired. Additionally, it is possible to create a path having any desired shape. Further, it is possible to create two or more conductive paths in the same solid state heater. These two or more conductive paths may be completely separate with separate electrical contacts, or may share the electrical contacts. Indeed, these conductive paths can have different lengths and widths, creating different temperature profiles for each conductive path.

Further, the use of a unitary component adds rigidity and structural integrity to the solid state heater, as silicon carbide has high flexural strength, high tensile strength and a high elastic modulus. Thus, the silicon carbide protects the less rigid graphite contained in the unitary component.

The solid state heaters disclosed herein may be employed in various locations in an ion implantation system. For example, the solid state heaters may be disposed in or proximate to the arc chamber. Alternatively, the solid state heaters may be disposed as heated chamber liners.

Additionally, the solid state heaters may be employed in other applications. It is estimated that the solid state heaters may be used at temperatures up to 900° C. in atmosphere or an oxidizing environment. In inert environments, such as vacuum or argon, the temperature may be as high as 2500° C. This allows the solid state heater to be used in other applications where high temperature is used. For example, the solid state heaters may be used in metal processing, such as casting and forging. Additionally, the solid state heaters can be used in other applications that utilize high temperatures, such as crystal growth and kilns.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of manufacturing a solid state heater comprising:
    machining a graphite component to create a machined graphite component having thin portions and thicker portions;
    subjecting the machined graphite component to a chemical vapor conversion (CVC) process where silicon monoxide is introduced to a processing chamber containing the machined graphite component, wherein the CVC process creates a unitary component having a first portion where graphite is converted to silicon carbide and a second portion where the graphite remains; and
    connecting electrical contacts to the second portion.

2. The method of claim 1, wherein the first portion is created in a region that is less than a diffusion depth from a surface of the graphite component.

3. The method of claim 2, wherein the second portion comprises graphite that is further than the diffusion depth from either surface of the graphite component.

4. The method of claim 2, wherein a thickness of the thin portions is less than or equal to twice the diffusion depth.

5. The method of claim 2, wherein a thickness of the thicker portions is greater than twice the diffusion depth.

6. The method of claim 1, further comprising grinding a front surface and/or a rear surface of the unitary component.

7. The method of claim 6, wherein the front surface and/or the rear surface of the unitary component are planar after the grinding.

8. The method of claim 1, further comprising applying a coating to the unitary component.

9. The method of claim 8, wherein applying a coating comprises subjecting the unitary component to a chemical vapor deposition (CVD) process.

10. A method of manufacturing a solid state heater, comprising:
    subjecting a graphite component to a chemical vapor deposition (CVD) process to apply a silicon carbide coating to a surface of the graphite component;
    selectively removing the silicon carbide coating from portions of the surface to form a silicon carbide mask;
    subjecting the graphite component with the silicon carbide mask to a chemical vapor conversion (CVC) process where silicon monoxide is introduced to a processing chamber containing the graphite component with the silicon carbide mask, wherein the CVC process creates a unitary component having a first portion where graphite is converted to silicon carbide and a second portion where the graphite remains; and
    connecting electrical contacts to the second portion.

11. The method of claim 10, wherein the first portion is created in a region that is not covered by the silicon carbide mask, and the second portion is formed in the region under the silicon carbide mask.

12. The method of claim 10, further comprising grinding a surface of the unitary component to remove the silicon carbide mask.

13. The method of claim 10, further comprising applying a coating to the unitary component.

14. The method of claim 10, wherein the first portion is created in a region that is less than a diffusion depth from a surface of the graphite component not covered by the silicon carbide mask.

15. The method of claim 14, wherein a thickness of the graphite component is less than twice the diffusion depth.

* * * * *